(12) United States Patent
Fang et al.

(10) Patent No.: US 7,785,950 B2
(45) Date of Patent: Aug. 31, 2010

(54) DUAL STRESS MEMORY TECHNIQUE METHOD AND RELATED STRUCTURE

(75) Inventors: Sunfei Fang, LaGrangeville, NY (US); Jun Jung Kim, Fishkill, NY (US); Zhijiong Luo, Carmel, NY (US); Hung Y. Ng, New Milford, NJ (US); Nivo Rovedo, LaGrangeville, NY (US); Young Way Teh, Singapore (SG)

(73) Assignees: International Business Machines Corporation, Armonk, NY (US); Samsung Electronics Co., Ltd, Gyeonggi-do (KR); Chartered Semiconductor Manufacturing Ltd, Singapore (SG)

( * ) Notice: Subject to any disclaimer, the term of this patent is extended or adjusted under 35 U.S.C. 154(b) by 898 days.

(21) Appl. No.: 11/164,114

(22) Filed: Nov. 10, 2005

(65) Prior Publication Data

US 2007/0105299 A1    May 10, 2007

(51) Int. Cl.
  *H01L 21/8238* (2006.01)
  *H01L 21/469* (2006.01)
(52) U.S. Cl. .............................. 438/199; 257/E21.632; 438/791
(58) Field of Classification Search ................. 438/199, 438/791; 257/E21.632
  See application file for complete search history.

(56) References Cited

U.S. PATENT DOCUMENTS

| 3,602,841 | A | 8/1971 | McGroddy |
| 4,665,415 | A | 5/1987 | Esaki et al. |
| 4,853,076 | A | 8/1989 | Tsaur et al. |
| 4,855,245 | A | 8/1989 | Neppl et al. |
| 4,952,524 | A | 8/1990 | Lee et al. |
| 4,958,213 | A | 9/1990 | Eklund et al. |
| 5,006,913 | A | 4/1991 | Sugahara et al. |
| 5,060,030 | A | 10/1991 | Hoke et al. |

(Continued)

FOREIGN PATENT DOCUMENTS

JP          64-76755        3/1989

(Continued)

OTHER PUBLICATIONS

Chen et al., "Stress Memorization Technique (SMT) by Selectively Strained-Nitride Capping for Sub-65nm High-Performance Strained-Si Device Application," Symposium on VLSI Technology Digest of Technical Papers, pp. 56-57, 2004.

(Continued)

*Primary Examiner*—Hsien-ming Lee
*Assistant Examiner*—Kevin Parendo
(74) *Attorney, Agent, or Firm*—Joseph Petrokaitis; Hoffman Warnick LLC

(57) ABSTRACT

A method for providing a dual stress memory technique in a semiconductor device including an nFET and a PFET and a related structure are disclosed. One embodiment of the method includes forming a tensile stress layer over the nFET and a compressive stress layer over the pFET, annealing to memorize stress in the semiconductor device and removing the stress layers. The compressive stress layer may include a high stress silicon nitride deposited using a high density plasma (HDP) deposition method. The annealing step may include using a temperature of approximately 400-1200° C. The high stress compressive silicon nitride and/or the anneal temperatures ensure that the compressive stress memorization is retained in the pFET.

13 Claims, 7 Drawing Sheets

U.S. PATENT DOCUMENTS

| | | | |
|---|---|---|---|
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,372,291 B1* | 4/2002 | Hua et al. | 427/255.28 |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,621,392 B1 | 9/2003 | Volant et al. | |
| 6,635,506 B2 | 10/2003 | Volant et al. | |
| 6,717,216 B1 | 4/2004 | Doris et al. | |
| 6,831,292 B2 | 12/2004 | Currie et al. | |
| 6,881,665 B1* | 4/2005 | Tsui et al. | 438/637 |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0029323 A1* | 2/2004 | Shimizu et al. | 438/142 |
| 2004/0113174 A1* | 6/2004 | Chidambarrao et al. | 257/200 |
| 2005/0093059 A1* | 5/2005 | Belyansky et al. | 257/327 |
| 2005/0093081 A1* | 5/2005 | Belyansky et al. | 257/392 |
| 2005/0156208 A1* | 7/2005 | Lin et al. | 257/288 |
| 2005/0194596 A1 | 9/2005 | Chan et al. | |
| 2005/0199958 A1* | 9/2005 | Chen et al. | 257/368 |
| 2006/0091471 A1* | 5/2006 | Frohberg et al. | 257/369 |
| 2006/0148270 A1* | 7/2006 | Lu et al. | 438/763 |
| 2006/0228848 A1* | 10/2006 | Chan et al. | 438/199 |
| 2007/0010073 A1* | 1/2007 | Chen et al. | 438/486 |
| 2007/0018252 A1* | 1/2007 | Zhu | 257/369 |
| 2007/0040225 A1* | 2/2007 | Yang | 257/369 |
| 2007/0075360 A1* | 4/2007 | Chang et al. | 257/330 |
| 2007/0105299 A1 | 5/2007 | Fang et al. | |

FOREIGN PATENT DOCUMENTS

| | | |
|---|---|---|
| SG | 132585 A1 | 6/2007 |
| SG | 151256 A1 | 4/2009 |

OTHER PUBLICATIONS

Kern Rim, et al., "Transconductance Enhancement in Deep Submicron Strained-Si n-MOSFETs". International Electron Devices Meeting, 26, 8, 1, IEEE, Sep. 1998.

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and Its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dewndence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors- Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps", 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Nerve, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI $1-_x$GEx Strained Layers on (100) Si". Appl. Phys. Lett. 56 (5), Jan. 29, 1990, pp. 460-462.

IPOS International Search Report with Written Opinion, Jul. 15, 2009, 11 pages.

\* cited by examiner

DUAL STRESS MEMORY TECHNIQUE METHOD AND RELATED STRUCTURE

BACKGROUND OF THE INVENTION

1. Technical Field

The invention relates generally to stress memory techniques, and more particularly, to a method of providing a dual stress memory technique and related structure.

2. Background Art

The application of stresses to field effect transistors (FETs) is known to improve their performance. When applied in a longitudinal direction (i.e., in the direction of current flow), tensile stress is known to enhance electron mobility (or n-channel FET (nFET) drive currents) while compressive stress is known to enhance hole mobility (or p-channel FET (pFET) drive currents).

One manner of providing this stress is referred to as stress memorization technique (SMT), which includes applying an intrinsically stressed material (e.g., silicon nitride) over a channel region and annealing to have the stress memorized in, for example, the gate polysilicon or the diffusion regions. The stressed material is then removed. The stress, however, remains and improves electron or hole mobility, which improves overall performance. The anneal is typically provided as part of a dopant activation anneal.

One problem with SMT is that it is applicable only to n-type field effect transistors (nFETs). In particular, while a compressively stressed silicon nitride layer can be formed over a pFET to impart a compressive stress, the stress is removed for the most part by the subsequent and requisite dopant activation anneal. That is, most of the compressive stress is not memorized in the pFET.

In view of the foregoing, there is a need in the art to provide SMT for both nFETs and pFETs.

SUMMARY OF THE INVENTION

A method for providing a dual stress memory technique in a semiconductor device including an nFET and a pFET and a related structure are disclosed. One embodiment of the method includes forming a tensile stress layer over the nFET and a compressive stress layer over the pFET, annealing to memorize stress in the semiconductor device and removing the stress layers. The compressive stress layer may include a high stress silicon nitride deposited using a high density plasma (HDP) deposition method. The annealing step may include using a temperature of approximately 400-1200° C. The high stress compressive silicon nitride and/or the anneal temperatures ensure that the compressive stress memorization is retained in the pFET.

A first aspect of the invention provides a method of providing a dual stress memory technique in a semiconductor device including an nFET and a pFET, the method comprising the steps of: forming a first stress layer over the semiconductor device; forming an etch stop layer over the first stress layer; removing the first stress layer and the etch stop layer over a first one of the nFET and the pFET; forming a second stress layer over the semiconductor device, wherein a stress layer over the pFET includes a compressive stress silicon nitride; annealing to memorize stress in the semiconductor device; and removing the first and second stress layer and the etch stop layer.

A second aspect of the invention provides a method of providing a dual stress memory technique for a semiconductor device including an nFET and a pFET, the method comprising the steps of: forming a tensile stress layer over the nFET and a compressive stress layer over the pFET, wherein the compressive stress layer include a high stress film that retains at least partial compressive stress during a subsequent anneal; annealing to memorize stress in the semiconductor device; and removing the compressive and tensile stress layers.

A third aspect of the invention provides a semiconductor device comprising: an nFET having a tensile stress memorized into a part thereof; and a pFET having a compressive stress memorized into a part thereof.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
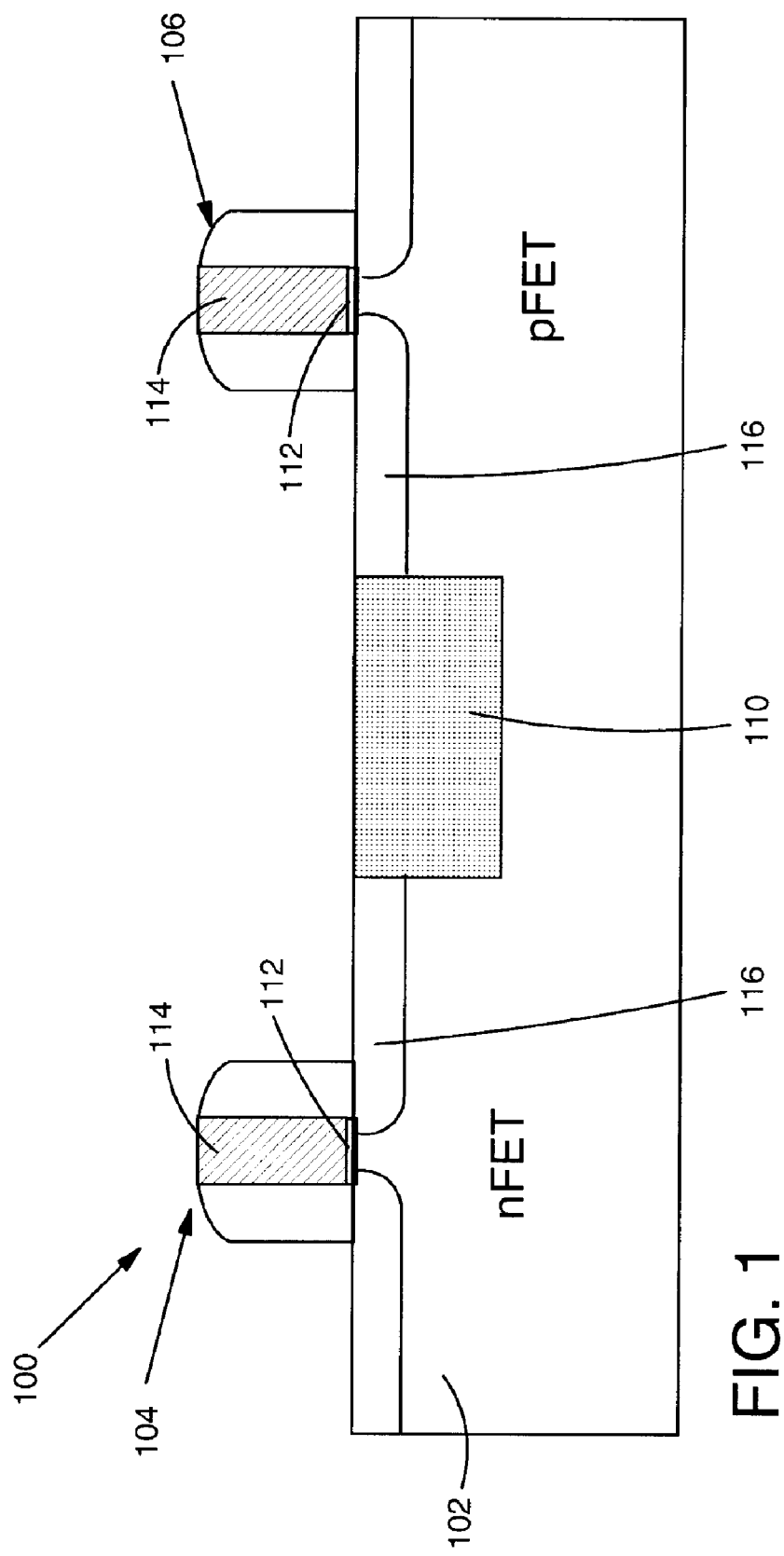
FIG. 1 shows a preliminary structure for one embodiment of a method according to the invention.

Turning to the drawings, FIG. 1 shows a preliminary structure for one embodiment of a method of providing a dual stress memory technique (SMT) for a semiconductor device 100. The preliminary structure includes a substrate 102 having an n-type field effect transistor (nFET) 104 and a p-type field effect transistor (pFET) 106 formed thereon. As shown, semiconductor device 100 has completed initial processing such as conventional shallow trench isolation (STI) 110 formation, well implants, gate dielectric 112 formation, gate conductor 114 formation, and extension/halo/source/drain implants for diffusions 116.

Figure 2:
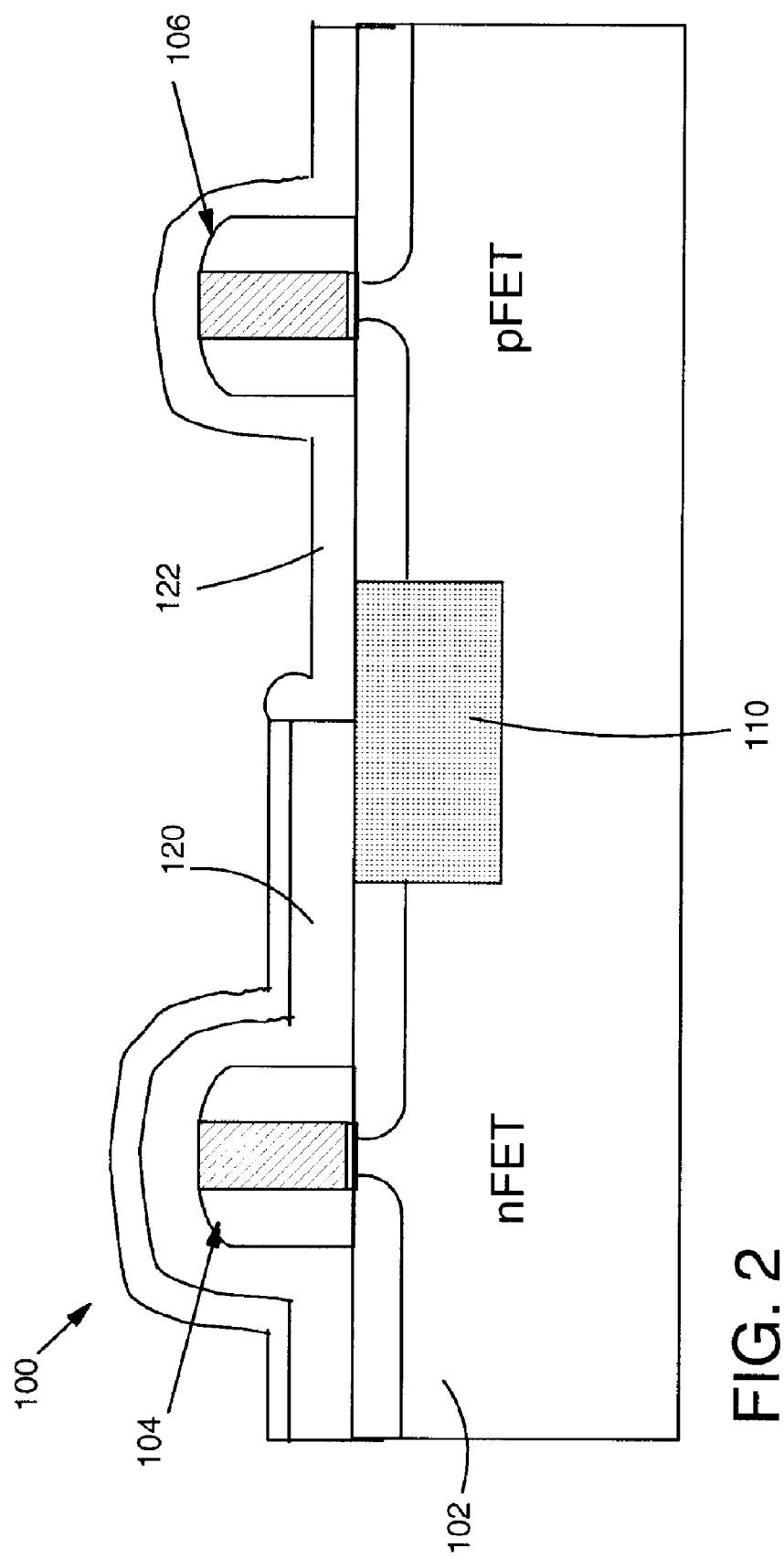
FIGS. 2-7 show a method according to one embodiment of the invention.

Referring to FIG. 2, in one embodiment of the method, a first step includes forming a tensile stress layer 120 over nFET 104 and a compressive stress layer 122 over pFET 106. Both tensile stress layer 120 and compressive stress layer 122 may include intrinsically stressed silicon nitride ($Si_3N_4$). In one preferred embodiment, however, compressive stress layer 122 includes a high density plasma (HDP) silicon nitride ($Si_3N_4$), i.e., a silicon nitride formed using a high density plasma deposition process. In one preferred embodiment, the compressive stress layer forming step includes performing a HDP deposition of silicon nitride using the following conditions: approximately 50 mTorr of pressure, approximately 200 standard cubic centimeters (sccm) of argon (Ar), approximately 100 sccm of silane ($SiH_4$), approximately 300 sccm of nitrogen ($N_2$), approximately 0-1500 W of radio frequency (RF) bias power and approximately 2000W-4500W of RF source power. Compressive stress layer 122 thus includes a high stress silicon nitride that enables provision of the dual SMT because it allows retention of compressive stress (full or partial) such that the stress is memorized in parts of pFET 106 during the subsequent anneal step, described below.

Figure 3:
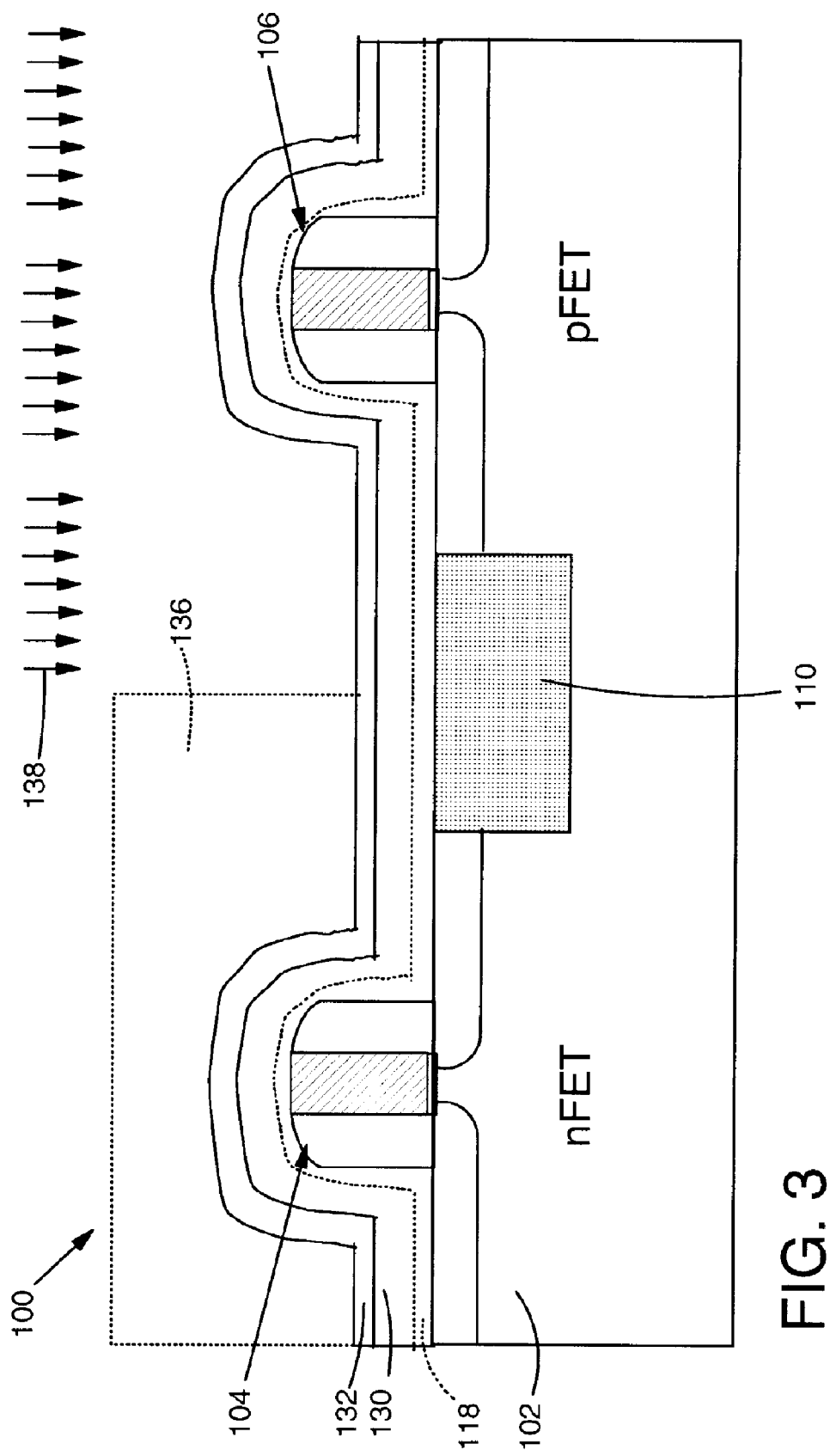
Figure 4:
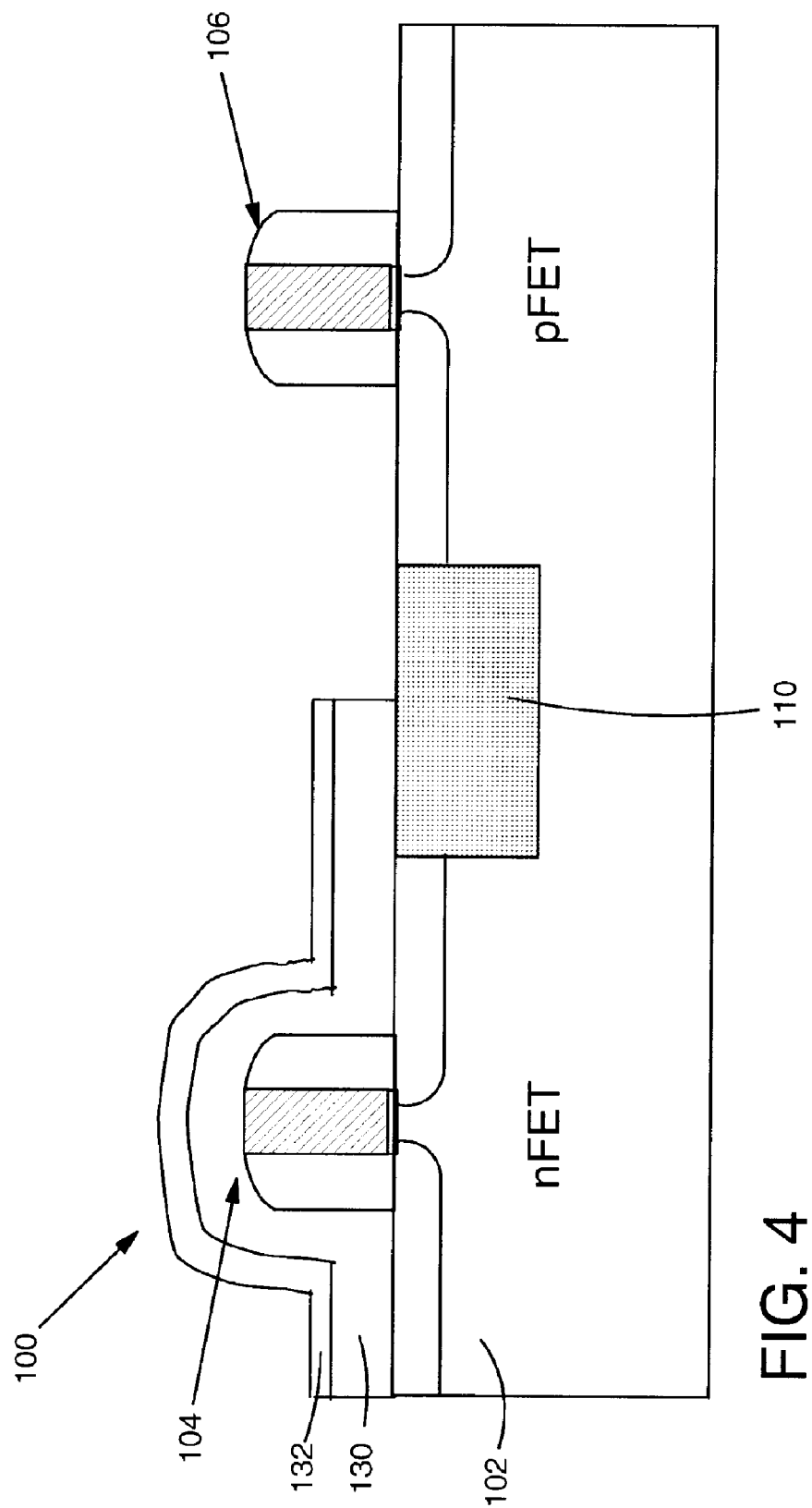

The forming step may be provided in any number of fashions, only two illustrative embodiments of which will be described herein. FIGS. 3-6 show the two illustrative embodiments. A first optional preliminary step includes, as shown in FIG. 3, forming an etch stop layer 118, e.g., of silicon dioxide (SiO$_2$), (shown in phantom in FIG. 3 only). Next, a first sub-step, shown in FIG. 3, includes forming a first stress layer 130 over semiconductor device 100. As will be described below, first stress layer 130 may be either tensile stress layer 120 (FIG. 2) or compressive stress layer 122 (FIG. 2). As shown in FIG. 3, however, first stress layer 130 includes an intrinsically tensilely stressed silicon nitride. A second sub-step, also shown in FIG. 3, includes forming an etch stop layer 132 over first stress layer 130. Etch stop layer 132 may include any now known or later developed etch stop material such as silicon dioxide (SiO$_2$). Next, as also shown in FIG. 3, first stress layer 130 and etch stop layer 132 are removed over a first one of nFET 104 and pFET 106 (pFET 106 as shown) to expose one of the FETs. The etching 138 may include use of a patterned mask 136 (shown in phantom) and any conventional dry etching chemistry for the materials used. FIG. 4 shows the resulting structure including exposed pFET 106.

Figure 5:
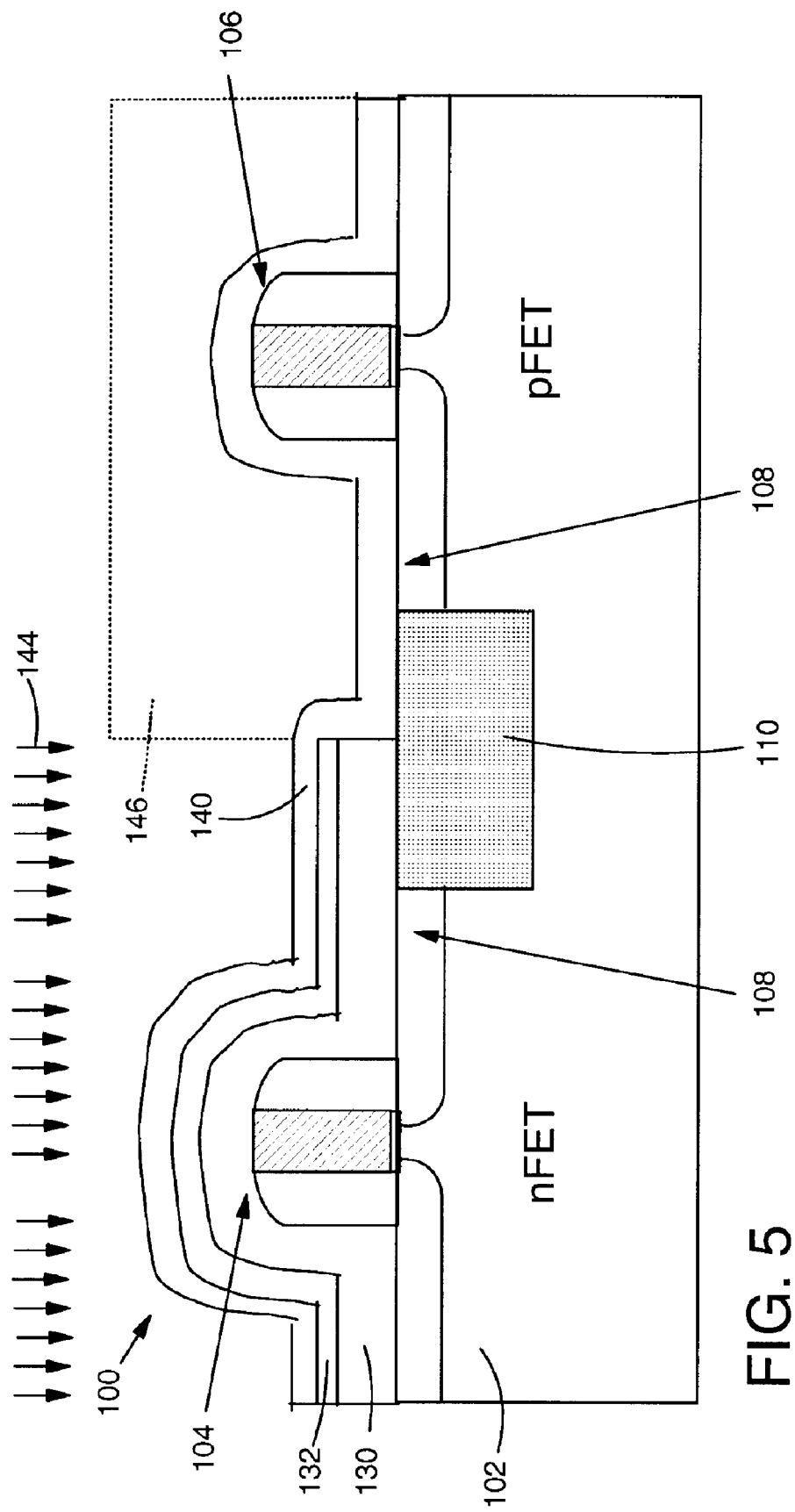
Figure 6:
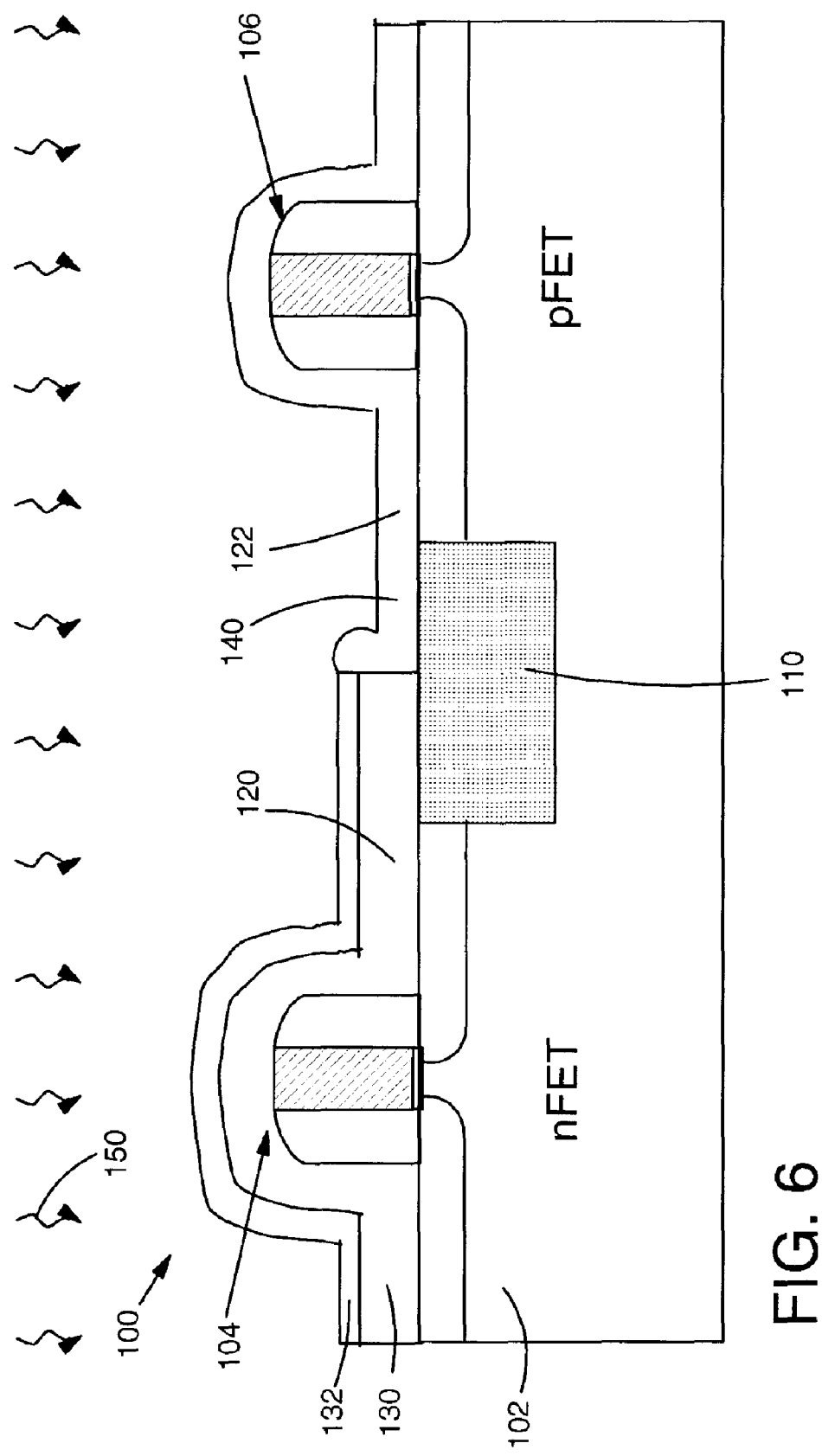

Next, as shown in FIG. 5, a second stress layer 140 is formed over semiconductor device 100. As shown, second stress layer 140 is formed over pFET 106 and, hence, includes the above-described high density, compressive stress silicon nitride. In one alternative embodiment, a next step may include removing second stress layer 140 over nFET 104 prior to the annealing step, described below. The removing step may include use of a patterned mask 146 (shown in phantom) and any conventional dry etching 144 for the materials used. FIG. 6 shows the resulting structure. Where second stress layer 140 is not removed, it should be recognized that some degradation of stress imparted by first stress layer 130 may be present, but that this degradation is minimal.

In an alternative embodiment, the above-described steps may be switched. That is, the forming step may include forming a compressive stress layer 122 over semiconductor device 100, forming an etch stop layer 132 over the compressive stress layer, removing compressive stress layer 122 and etch stop layer 132 over nFET 104, and forming a tensile stress layer 120 over semiconductor device 100. As in the above-described embodiment, tensile stress layer 120 may be optionally removed over pFET 106 prior to the annealing step, described below. Where tensile stress layer 120 is not removed, it should be recognized that some degradation of stress imparted by compressive stress layer 122 may be present, but that this degradation is minimal.

FIG. 6 also shows a second step according to one embodiment of the method, which includes annealing 150 to memorize stress in semiconductor device 100. Annealing 150 preferably includes using a temperature of no less than approximately 400° C. and no greater than approximately 1200° C. The anneal temperature is optimized so that device 100 will be able to memorize the stress from stress layers 120, 122, and not lose the compressive stress on parts of pFET 106, which would result in a neutral or tensile stress thereon. For example, one conventional plasma-enhanced chemical vapor deposited (PECVD) compressive silicon nitride, which is formed with approximately −1.8 GPa of stress drops to approximately 0.04 GPa, i.e., a tensile stress, after anneal. In contrast, one embodiment an HDP compressive stress silicon nitride according to the invention is formed with approximately −3.0 GPa, which results in a stress of no less than −100 MPa, thus retaining a compressive stress. In one embodiment, the compressive stress may be in the range of approximately −1 GPa.

Figure 7:
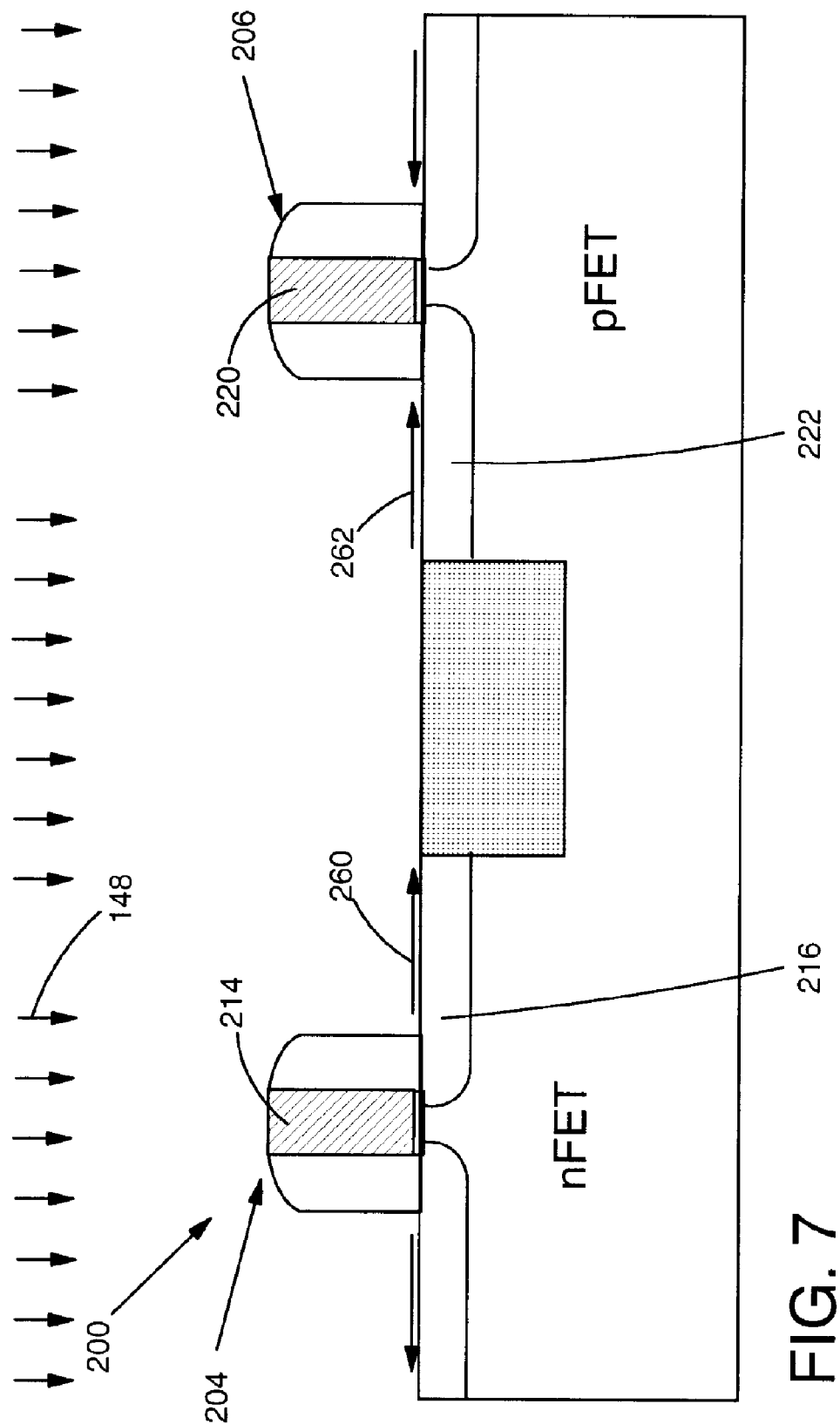

FIG. 7 shows a third step including removing stress layers 120, 122 and etch stop layer 132. This removing step 148 may include a wet or dry etch, or combination of them; for example, a wet or dry etch to remove etch stop layer 132 and then a wet strip using hot phosphorous acid to remove silicon nitride stress layers. FIG. 7 also shows a semiconductor device 200 according to the invention including an nFET 204 having a tensile stress 260 memorized into a part thereof, e.g., gate conductor 214 and/or diffusion region 216, and a pFET 206 having a compressive stress 262 memorized into a part thereof, e.g., gate conductor 220 and/or diffusion region 222.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of providing a dual stress memory technique in a semiconductor device including an nFET and a pFET, the method comprising:
forming a first stress layer over the nFET and the pFET, wherein the first stress layer is an intrinsically compressive stressed layer
forming an etch stop layer over the first stress layer;
removing the first stress layer and the etch stop layer over the nFET
forming a second stress layer over a remaining portion of the first stress layer and the nFET, wherein the second stress layer is a tensilely stressed silicon nitride layer;
annealing to memorize stress in the nFET and the pFET, wherein the remaining portion of the first stress layer remains over the pFET during the annealing, and the second stress layer remains over both the nFET and the pFET during the annealing; and;
removing the first and second stress layers and the etch stop layer in their entirety, wherein the memorized stress is retained in the nFET and the pFET after the annealing and the removing of the first and second stress layers.

2. The method of claim 1, wherein the compressive stress silicon nitride includes a high density plasma (HDP) silicon nitride.

3. The method of claim 1, further comprising the step of depositing an additional etch stop layer prior to the first stress layer forming step.

4. The method of claim 1, wherein the compressive stress silicon nitride has a magnitude of stress of no less than 100 MPa after the annealing.

5. The method of claim 1, wherein the annealing step includes using a temperature of no less than approximately 400° C. and no greater than approximately 1200° C.

6. The method of claim 1, wherein each stress layer includes silicon nitride.

7. The method of claim 1, wherein the etch stop layer includes silicon dioxide.

8. A method of providing a dual stress memory technique for a semiconductor device including an nFET and a pFET, the method comprising:
forming a tensile stress layer over only the nFET and forming a compressive stress layer over the pFET and the tensile stress layer overlying the nFET, wherein the compressive stress layer includes silicon nitride;
annealing to memorize stress in the nFET and the pFET, wherein the tensile stress layer remains over only the nFET and the compressive stress layer remains over the pFET and the tensile stress layer overlying the nFET during the annealing; and removing the compressive and tensile stress layers in their entirety, wherein the memorized stress is retained in the nFET and the pFET after the annealing and the removing of the compressive and tensile stress layers.

9. The method of claim 8, wherein the compressive stress layer forming step includes performing a high density plasma (HDP) deposition of the silicon nitride using the following conditions: approximately 50 mTorr of pressure, approximately 200 standard cubic centimeters (sccm) argon (Ar), approximately 100 sccm of silane ($SiH_4$), approximately 300 sccm of nitrogen ($N_2$), approximately 0-1500 W of radio frequency (RF) bias power and approximately 2000 W-4500 W of RF source power.

10. The method of claim 8, wherein the annealing step includes using a temperature of no less than approximately 400° C. and no greater than approximately 1200 ° C.

11. The method of claim 8, wherein the tensile stress layer includes silicon nitride.

12. The method of claim 8, wherein the forming step includes:

forming the tensile stress layer over the nFET and the pFET;

forming an etch stop layer over the tensile stress layer;

removing the tensile stress layer and the etch stop layer over the pFET; and forming the compressive stress layer over a remaining portion of the tensile stress layer and the pFET.

13. The method of claim 12, wherein the etch stop layer includes silicon dioxide.

\* \* \* \* \*